(12) United States Patent
She et al.

(10) Patent No.: US 10,622,224 B2
(45) Date of Patent: Apr. 14, 2020

(54) PRECLEANING CHAMBER AND PLASMA PROCESSING APPARATUS

(71) Applicant: BEIJING NAURA MICROELECTRONICS EQUIPMENT CO., LTD., Beijing (CN)

(72) Inventors: Qing She, Beijing (CN); Peng Chen, Beijing (CN); Mengxin Zhao, Beijing (CN); Peijun Ding, Beijing (CN); Kui Xu, Beijing (CN); Guodong Bian, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 290 days.

(21) Appl. No.: 15/529,709

(22) PCT Filed: Nov. 25, 2015

(86) PCT No.: PCT/CN2015/095480
§ 371 (c)(1),
(2) Date: May 25, 2017

(87) PCT Pub. No.: WO2016/082753
PCT Pub. Date: Jun. 2, 2016

(65) Prior Publication Data
US 2017/0330769 A1    Nov. 16, 2017

(30) Foreign Application Priority Data

Nov. 26, 2014   (CN) .......................... 2014 1 0696531

(51) Int. Cl.
*H01L 21/67* (2006.01)
*B08B 7/00* (2006.01)
(Continued)

(52) U.S. Cl.
CPC ...... *H01L 21/67028* (2013.01); *B08B 7/0035* (2013.01); *C23C 16/0245* (2013.01);
(Continued)

(58) Field of Classification Search
None
See application file for complete search history.

(56) References Cited

U.S. PATENT DOCUMENTS

| 5,091,049 A * | 2/1992 | Campbell ............. H01J 37/321 |
| | | 118/50.1 |
| 2011/0315319 A1* | 12/2011 | Forster .............. H01J 37/32082 |
| | | 156/345.29 |

(Continued)

FOREIGN PATENT DOCUMENTS

| CN | 101459051 A | 6/2009 |
| CN | 101667527 A | 3/2010 |

(Continued)

OTHER PUBLICATIONS

The World Intellectual Property Organization (WIPO) International Search Report for PCT/CN2015/095480, 7 pages, dated Feb. 4, 2016.

*Primary Examiner* — Jethro M. Pence
(74) *Attorney, Agent, or Firm* — Anova Law Group, PLLC

(57) ABSTRACT

A precleaning chamber (100, 200, 300) and a plasma processing apparatus, comprising a cavity (20) and a dielectric window (21, 21') disposed at the top of the cavity (20), a base (22) and a process assembly (24) surrounding the base (22) are disposed in the precleaning chamber (100, 200, 300), and the base (22), the process assembly (24) and the dielectric window (21, 21') together form a process subcavity (211) above the base (22); and a space of the cavity (Continued)

(20) located below the base (22) is used as a loading/unloading sub-cavity (202), the precleaning chamber (100, 200, 300) further comprises a gas is device (32), the gas inlet device (32) comprises a gas inlet (323), and the gas inlet (323) is configured to directly transport a process gas into the process sub-cavity (211) from above the process assembly (24). The precleaning chamber (100, 200, 300) not only shortens the gas inlet path of the process gas, but also reach a desired plasma density under the conditions where a relatively small amount of process gas is introduced, thereby reducing the usage cost.

18 Claims, 5 Drawing Sheets

(51) Int. Cl.
*H01J 37/32* (2006.01)
*H01L 21/02* (2006.01)
*C23C 16/02* (2006.01)

(52) U.S. Cl.
CPC ...... *H01J 37/321* (2013.01); *H01J 37/32082* (2013.01); *H01J 37/32458* (2013.01); *H01J 37/32513* (2013.01); *H01J 37/32651* (2013.01); *H01J 37/32834* (2013.01); *H01J 37/32853* (2013.01); *H01J 37/32862* (2013.01); *H01L 21/02046* (2013.01); *H01L 21/67069* (2013.01); *H01J 2237/334* (2013.01)

(56) References Cited

U.S. PATENT DOCUMENTS

| | | | |
|---|---|---|---|
| 2012/0138229 A1* | 6/2012 | Sakka | H01J 37/321 156/345.33 |
| 2014/0261177 A1* | 9/2014 | Rasheed | C23C 14/0063 118/720 |

FOREIGN PATENT DOCUMENTS

| | | |
|---|---|---|
| CN | 103014745 A | 4/2013 |
| CN | 103035468 A | 4/2013 |
| WO | 9607769 A1 | 3/1996 |

* cited by examiner

PRECLEANING CHAMBER AND PLASMA PROCESSING APPARATUS

CROSS-REFERENCES TO RELATED APPLICATIONS

This application is a national phase entry under 5 U.S.C § 371 of International Application No. PCT/CN2015/095480, filed on Nov. 25, 2015, which claims priority of Chinese Patent Application No. 201410696531.9 filed with the State Intellectual Property Office of P.R. China on Nov. 26, 2014, the entire contents of all of which are incorporated herein by reference.

FIELD OF THE DISCLOSURE

The present disclosure relates to the field of semiconductor device manufacturing and, more specifically, relates m a precleaning chamber and a plasma processing apparatus.

BACKGROUND

Plasma processing apparatuses are widely applied in current manufacturing processes of semiconductor integrated circuits, solar cells, flat panel displays and the like. The types of plasma processing apparatuses that have been widely used in the industry include, for example, DC discharge plasma, capacitively coupled plasma (CCP), inductively coupled plasma (ICP), and electron cyclotron resonance (ECR) plasma. Such types of plasma processing apparatuses are currently used in processes such as deposition, etching and cleaning.

In a processing process, in order to improve the product quality, the wafer needs to be pre-cleaned before the deposition process is implemented, such that foreign a matters such as the oxide on surface of the water are removed. Generally, the basic principle of a precleaning chamber is to excite a cleaning gas (e.g., argon, helium or hydrogen) that is injected into the cleaning chamber to fort plasma, thereby performing chemical reaction and physical bombardment on the wafer. Accordingly, the foreign matters on the surface of the wafer may be removed.

FIG. 1 is a structural schematic view of an existing precleaning chamber. FIG. 2 is an enlarged partial view of FIG. 1. Referring to both FIG. 1 and FIG. 2, the precleaning chamber comprises a cavity 8 and a dielectric window 4 disposed at a top of the cavity 8. A base 1 for carrying a wafer 2 is disposed in the precleaning chamber and is connected to a first RF power supply 12 via a first adapter 11, and the dielectric window 4 is an arched top cover made of an insulating material (e.g., ceramic or quartz). A coil 5 is configured above the dielectric window 4, and the coil 5 may be a solenoid coil connected to a second RF power supply 6 via a second adapter 3. Further, in the precleaning chamber, a process assembly 7 is disposed around the base 1. The process assembly 7, the base 1, and the dielectric window 4 together form a process cavity 41, and a space of the cavity 8 below the base 1 is used as a loading/unloading cavity. Further, as shown in FIG. 2, the process assembly 7 forms a gas inlet/outlet passage with a maze structure for the process gas in the loading/unloading cavity to get in and out of the process cavity 41. Further, a gas inlet line 9 is further disposed on the cavity 8 for transporting a process gas into the loading/unloading cavity. Flow directions of the process gas are indicated by the arrows in FIG. 1. The process gas enters the loading/unloading cavity through the gas inlet line 9, and then diffuses upwards. After the flow is homogenized in the maze structure formed by the process assembly 7, the process gas enters the process cavity 41 to be excited to form plasma. The process gas after reaction enters the loading/unloading cavity after passing through the process assembly 7 and is pumped out by a vacuum pump 10.

In practical applications, the following issues inevitably exist in the aforementioned precleaning chamber:

Firstly, the path fir the process gas to enter the process cavity 41 is too long, such that a relatively long time is needed for the process gas to arrive at the process cavity 41, thereby affecting the process efficiency;

Secondly, because an air pressure within the process cavity 41 is greater than an air pressure near an exhaust port of the vacuum pump 10 and the vacuum pump 10 remains in an operation status during the processing process, most of the process gas is directly pumped out by the vacuum pump 10 before entering the process cavity 41. Accordingly, a large amount of the process gas needs to be supplemented continuously via the gas inlet line 9, such that the plasma remains in an excited state and maintains a desired plasma density, resulting in a waste of the process gas.

SUMMARY OF THE DISCLOSURE

The present disclosure is directed to solving at least one technical issue in the prior art, and provides a precleaning chamber and a plasma processing apparatus. As such, not only the gas inlet path of the process gas may be shortened, but a desired plasma density may be reached under conditions where a relatively small amount of process gas is used, thereby reducing the usage cost.

The present disclosure provides a precleaning chamber, comprising a cavity and a dielectric window disposed at a top of the cavity, where a base and a process assembly surrounding the base are disposed in the precleaning chamber. The base, the process assembly, and the dielectric window together form a process sub-cavity above the base, and a space of the cavity located below the base is used as a loading/unloading sub-cavity. The precleaning chamber further comprises a gas inlet device. The gas inlet device includes a gas inlet, and the gas inlet is for directly transporting a process gas into the process sub-cavity above the process assembly.

Preferably, the gas inlet device further comprises an annular flow homogenizing cavity. The annular flow homogenizing cavity is connected to the gas inlet, and is connected to the process sub-cavity via a plurality of gas outlet ports. The plurality of gas outlets are distributed uniformly along a circumferential direction of the process sub-cavity.

Preferably, the gas inlet device comprises: a gas inlet ring. The gas inlet ring is located between the dielectric window and the cavity, and is respectively and tightly coupled to the dielectric window and the cavity. Further, at least one first through-hole is formed on an inner circumferential wall of the gas inlet ring that penetrates through the inner circumferential wall in a radial direction thereof, and the at least one: first through-hole is used as the gas inlet. A flow homogenizing ring is located at an inner side of the gas inlet ring and forms an annular space used as the annular flow homogenizing cavity together with the inner circumferential wall of the gas inlet ring. Further an annular flow homogenizing unit is formed at a top of the flow homogenizing ring, and the annular flow homogenizing unit comprises a plurality of second through-holes distributed uniformly along the circumferential direction of the process sub-cavity.

The second through-holes are respectively connected to the annular space and the process sub-cavity, and are used as the gas outlets.

Preferably, the gas inlet comprises a central gas inlet disposed at a central position of the dielectric window.

Preferably, the gas inlet comprises at least two top gas inlets that are uniformly distributed at different positions of the dielectric window.

Preferably, the precleaning chamber further comprises a filter plate, and the filter plate divides the process sub-cavity into an upper sub-space and a lower sub-space, where the gas inlet is connected to the upper sub-space. Further, a plurality of vent holes are distributed on the filter plate. The vent holes are respectively connected to the upper sub-space and the lower sub-space, and are configured to filter ions in the plasma when the plasma formed in the upper sub-space passes through the vent holes.

Preferably, the process assembly comprises an upper ring body and a lower ring body, the upper ring body is located at an inner side of the lower ring body, and an annular gap is formed between an outer circumferential wall of the upper ring body acid an inner circumferential wall of the lower ring body. Further, a plurality of third through-holes are disposed on the inner circumferential wall of the lower ring body and above a lower end of the upper ring body, and the plurality of third through-holes are uniformly distributed along the circumferential direction of the process sub-cavity. The annular gap and each third through-hole form an exhaust port for discharging the gas in the process sub-cavity info the loading/unloading sub-cavity.

Preferably, the dielectric window has an arched structure or a barrel structure.

Preferably, a Faraday shield member is disposed around an inner side of the dielectric window, and the Faraday shield member is made of a metal material or an insulating material with a surface plated with a conductive material. Further, at least one slot is configured at the Faraday shield member along an axial direction thereof.

As another technical solution, the present disclosure further provides a plasma processing apparatus comprising a precleaning chamber, and the precleaning chamber may be the precleaning chamber provided by the present disclosure.

The present disclosure has the following beneficial effects.

The precleaning chamber provided by the present disclosure may directly transport the process gas to the process sub-cavity from above the process assembly by virtue of the gas inlet of the gas inlet device, thereby shortening the gas inlet path of the process gas and reducing the time needed for the process gas to arrive at the plasma generation area. Accordingly, the process efficiency may be improved, and all process gases from the gas inlet may be allowed to enter the process sub-cavity, thereby avoiding situations in the prior art where a part of the process gas is directly pumped out without reaction. Thus, a relatively high plasma density may be achieved under conditions where a relatively small amount of process gas is introduced, such that the usage cost may be reduced.

The plasma processing apparatus provided by the present disclosure may adopt the aforementioned precleaning chamber provided in the present disclosure, such that not only the gas inlet path of the process gas is shortened, but also a desired plasma density is achieved under conditions where a relatively small amount of process gas is introduced. Accordingly, the usage cost may be reduced.

DETAILED DESCRIPTION

To enable those skilled in the relevant art to better understand the technical solutions of the present disclosure, the precleaning chamber and the plasma processing apparatus provided by the present disclosure will be described in detail hereinafter with reference to the accompanying drawings.

Figure 1:
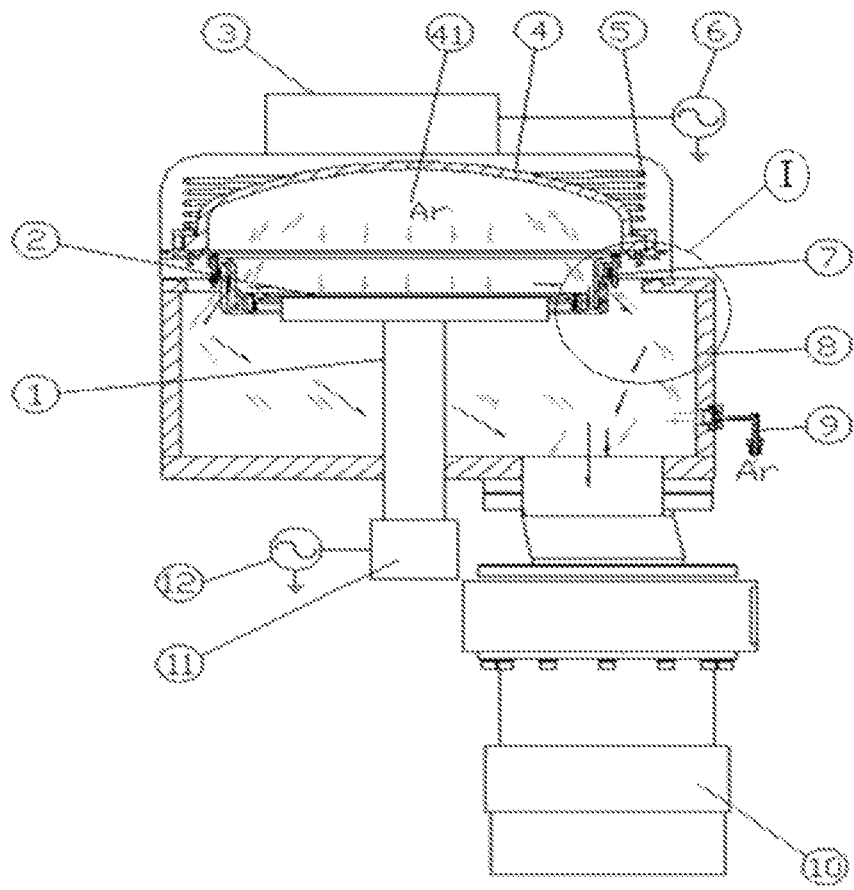
FIG. 1 is a structural schematic view of an existing precleaning chamber.
Figure 2:
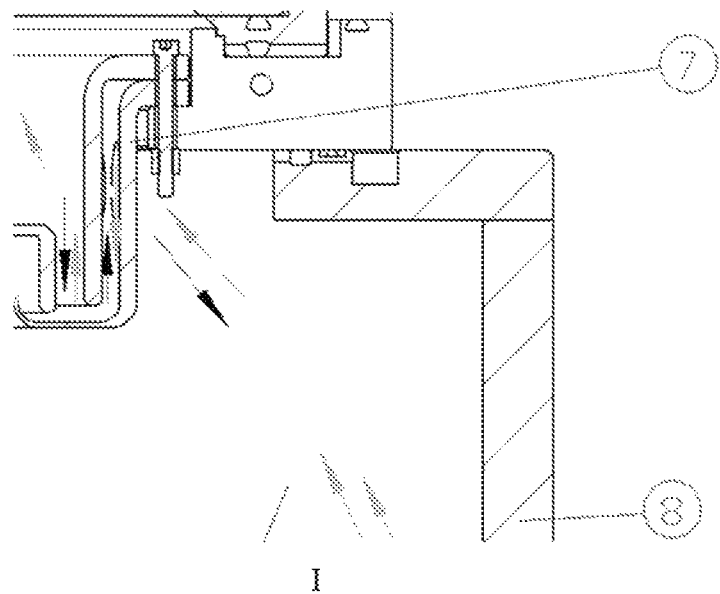
FIG. 2 is an enlarged partial view of FIG. 1.
Figure 3A:
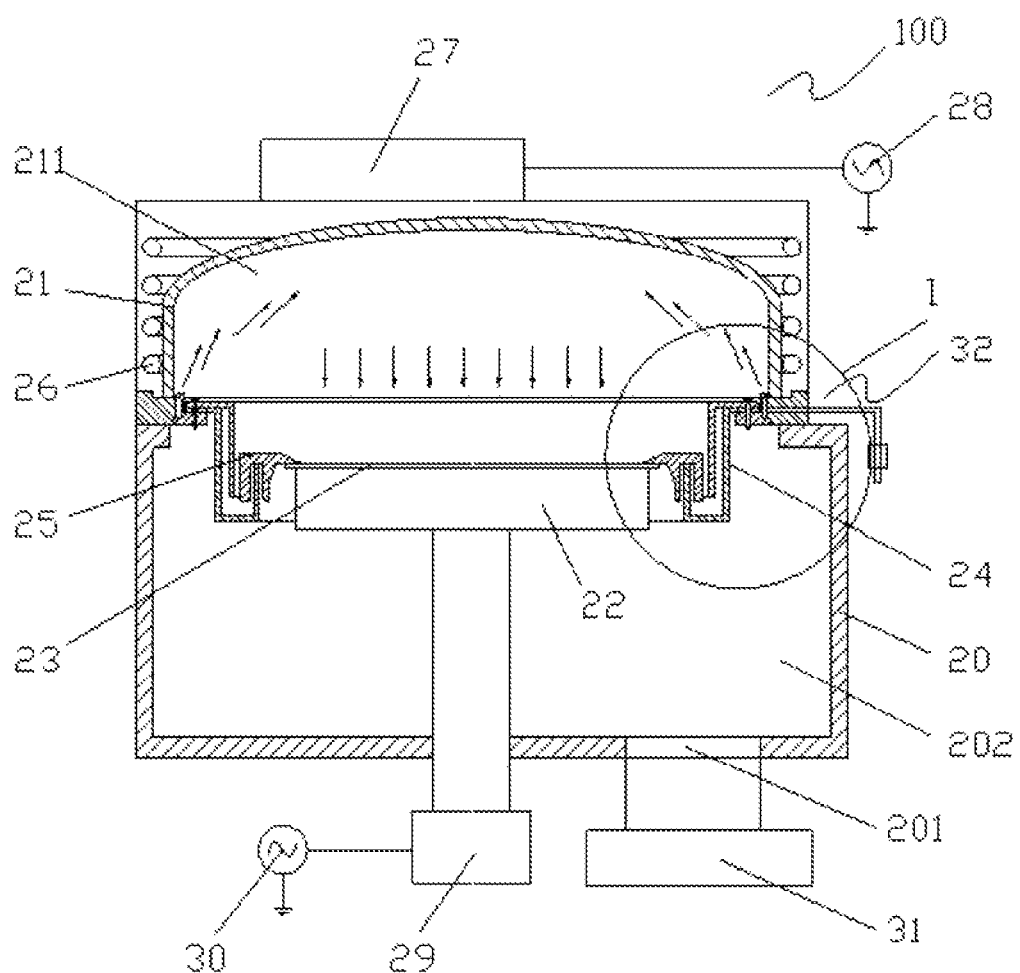
FIG. 3A is a cross-sectional view of a precleaning chamber provided by a first embodiment of the present disclosure.
Figure 3B:
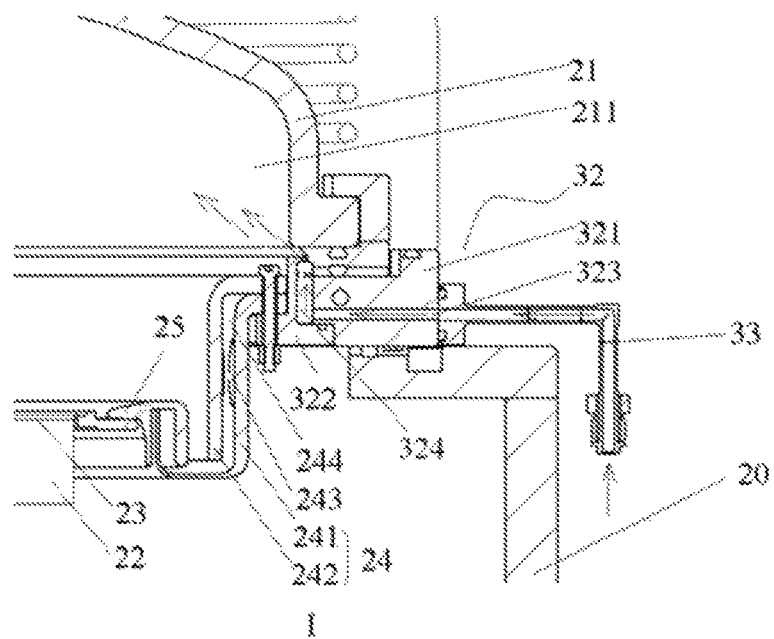
FIG. 3B is an enlarged view of an area 1 in FIG. 3A.

FIG. 3A is a cross-sectional view of a precleaning chamber provided by a first embodiment of the present disclosure. FIG. 3B is an enlarged view of an area 1 in FIG. 3A. Referring to both FIG. 3A and FIG. 3B, the precleaning chamber 100 comprises a cavity 20 and a dielectric window 21 disposed at a top of the cavity 20. A base 22 for carrying a wafer 23 is disposed in the precleaning chamber 100 and is connected to a first RF power supply 30 via a first adapter 29. The dielectric window 21 is an arched top cover made of an insulating material (e.g., ceramic or quartz), and a coil 26 is configured above the dielectric window 21. The coil 26 is a solenoid coil and is connected to a second RF power supply 28 via a second adapter 27. Further, in the precleaning chamber 100, a process assembly 24 is disposed surrounding the base 22. When the base 22 is at a process position, the process assembly 24, the base 22, and the dielectric window 21 together form a process sub-cavity 211 above an upper surface of the base 22, and the cavity 20 and the base 22 together form a loading/unloading sub-cavity 202 below the upper surface of the base 22.

The precleaning chamber 100 further comprises a gas inlet device 32 including a gas inlet. The gas inlet is configured to directly transport a process gas into the process sub-cavity 211 from above the process assembly 24. The process gas usually includes Ar, $H_2$, He or the like. During a precleaning process, a now direction of the process gas entering the process sub-cavity 211 through the gas inlet is indicated by the arrows in FIG. 3A, and the process gas diffuses upwards and towards the center from the periphery of the process sub-cavity 211. The second RF power supply 28 and the first RF power supply 30 are turned on at the same time to excite the process gas in the process sub-cavity 211 to form plasma. The plasma diffuses towards the base 22 at a bottom of the process sub-cavity 211, and is attracted to bombard foreign matters on the wafer 23 under the effect of the RF self-bias voltage generated by the wafer 23, thereby realizing precleaning of the wafer 23.

By transporting the process gas directly from above the process assembly 24 into the process sub-cavity 211 by virtue of the gas inlet of the gas inlet device 32, not only the gas inlet path of the process gas may be shortened and the time needed for the process gas to arrive at the plasma generation area is reduced to improve the process efficiency. Further, all process gas from the gas inlet may be enabled to enter the process sub-cavity, thereby avoiding situations in the prior art where a part of the process gas is directly pumped out without reaction. Thus, a relatively high plasma density may be obtained under situations where a relatively small amount of process gas is introduced, such that the usage amount of the process gas is reduced, and the process cost is decreased.

Figure 4:
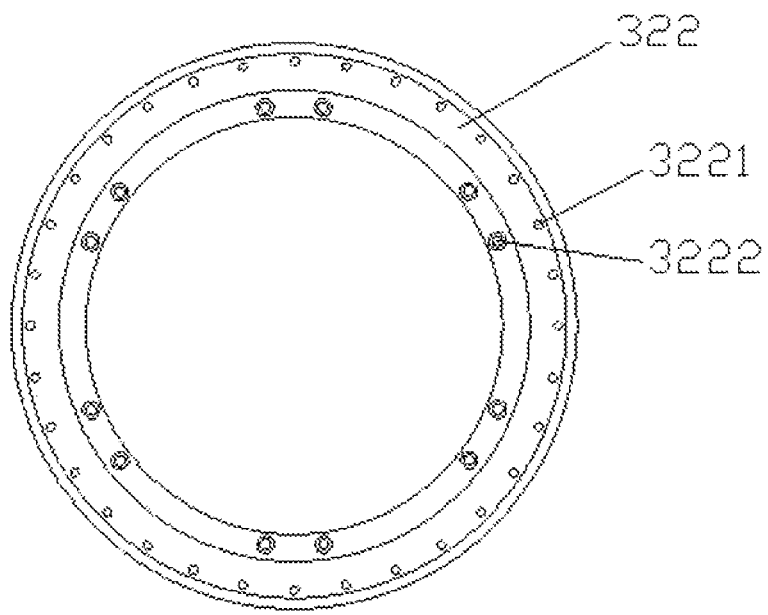
FIG. 4 is a top view of a flow homogenizing ring used in embodiments of the present disclosure.
Figure 5:
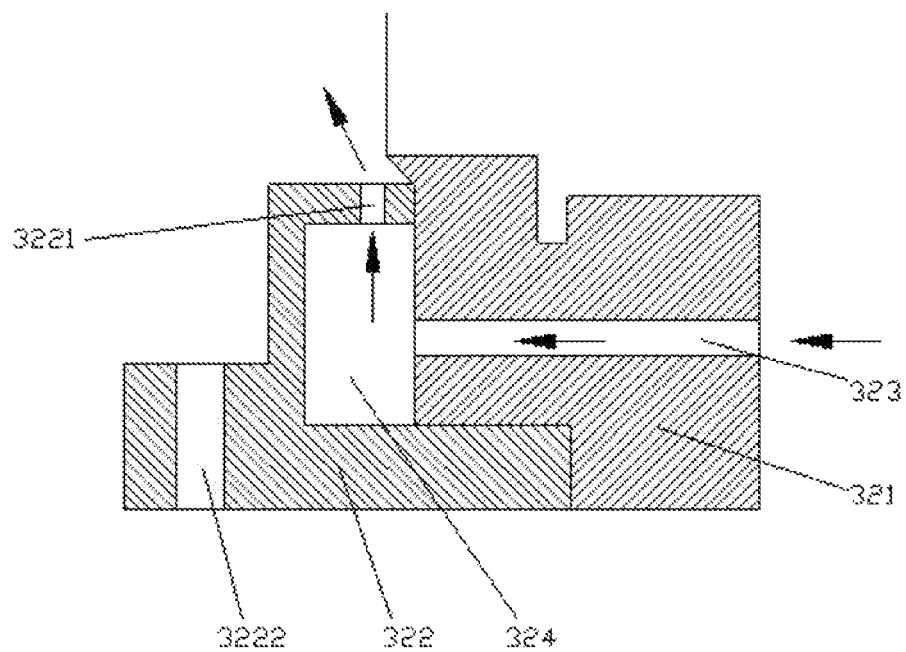
FIG. 5 is a cross-sectional view of a flow homogenizing ring used in embodiments of the present disclosure.

Hereinafter, a structure of the aforementioned gas inlet device 32 is described in detail. More specifically, as shown in FIG. 3B, the gas inlet device 32 comprises a gas inlet ring 321 and a flow homogenizing ring 322. In particular, the gas inlet ring 321 is located between the dielectric window 21 and the cavity 20, and is respectively and tightly coupled to the dielectric window 21 and the cavity 20. Further, at least one first through-hole 323 is formed on a side wall of the gas inlet ring 321 that penetrates through the side wall in a radial direction thereof. The first through-hole 323 is used as the aforementioned gas inlet and is connected to a gas inlet line 33. The flow homogenizing ring 322 is located at an inner side of the gas inlet ring 321 and forms an annular space 324 together with an inner circumferential gall of the gas inlet ring 321. The annular space 324 is used as an annular flow homogenizing cavity with a flow homogenizing function and is connected to the aforementioned first through-hole 323. Further, a specific structure of the flow homogenizing ring 322 is shown in FIG. 4 and FIG. 5, where an annular flow homogenizing unit is formed at a top of the flow homogenizing ring 322 and comprises a plurality of second through-holes 3221 distributed t uniformly along circumferential direction of the process sub-cavity 211. The second through-holes 3221 are respectively connected to the annular space 324 and the process sub-cavity 211, and are used as the gas outlets of the annular flow homogenizing cavity. Further, a plurality of mounting holes 3222 distributed uniformly along the circumferential direction of the process sub-cavity 211 are disposed on the inner side of the flow homogenizing ring 322, thereby fixedly connecting the flow homogenizing ring 322 to the cavity 20 by mounting a fastening member such as a bolt. During a precleaning process, the flow direction of the process gas entering the process sub-cavity 211 from the gas inlet line 33 is indicated by the arrows in FIG. 3B. The process gas enters the annular space 324 through the first through hole 323 and diffuses around until the annular space 324 is filled, and then uniformly flows into the process sub-cavity 211 through each of the plurality of second through-holes 3221.

It is easy to understand that, by disposing the second through-holes 3221 at the top of the annular space 324, the process gas flowing out of the second through-holes 3221 may diffuse to war s an upper portion of the process sub-cavity 211. Accordingly, the process gas maybe excited to form plasma at the upper portion of the process sub-cavity 211 and diffuse towards the base 22. Obviously, the present disclosure is not limited thereto. In practical applications, the second through-holes 3221 may also be disposed on an inner side of the annular space 324. That is, the second through-holes 3221 may also be disposed on a vertical side wall of the flow homogenizing ring 322. Actually, as long as the second through-holes 3221 are disposed above the process assembly 24, the process gas can be directly transported into the process sub-cavity 211, and thus the objective of the present disclosure may be achieved.

Figure 3C:
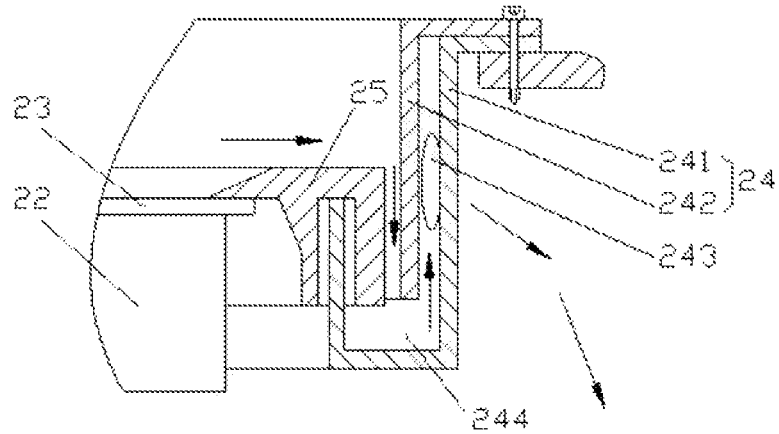
FIG. 3C is a partial cross-sectional view of a process assembly used in embodiments of the present disclosure.
Figure 3D:
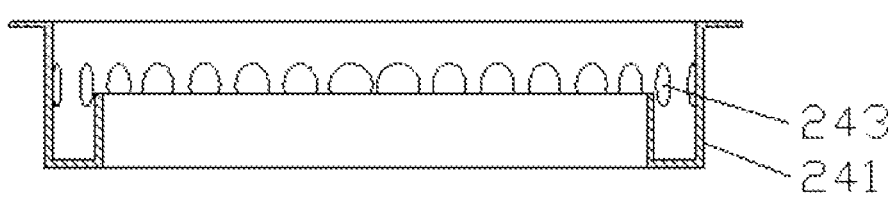
FIG. 3D is a cross-sectional view of a lower ring body of a process assembly used in embodiments of the present disclosure.

In one embodiment, as shown in FIGS. 3B-3D, the process assembly 24 is disposed surrounding the base 22 to form the process sub-cavity 211 above the base 22 together with the base 22 and the dielectric window 21. Specifically, the base 22 is liftable and may be moved up to a process position to process the wafer 23 placed thereon, or moved down to a loading: unloading position in the loading/unloading sub-cavity 202 to fetch or place a wafer using a manipulator. When the base 22 is at the processing position, the wafer 23 is mechanically fixed on the base 22 by using a press ring 25, and by then, the press ring 25 is in contact with a marginal a et, of an upper surface of the wafer 23, thereby sealing the process sub-cavity 211. When the base 22 leaves the processing position, the press ring 25 is separated from the marginal area of the wafer 23 and is carried by the process assembly 24.

Further, as shown in FIG. 3C, the process assembly 24 comprises an upper ring body 242 and a lower ring body 241. In particular, a cross-sectional view of the side wall of the upper ring body 242 sectioned along a plane where an axis of the upper ring body 242 is located displays an inverted "L" shape. A cross-sectional view of the side wall of the lower ring body 241 sectioned along a plane where an axis of the lower ring body 241 is located displays a hook shape. The hook shape may be seen as an "L" and an inverted "L," being spliced together, and an end (the rightmost end) of the horizontal stroke of the "L" is connected with an end (the lowermost end) of the vertical stroke of the inverted "L". A vertical portion of the upper ring body 242 is at an inner side of a vertical portion of the lower ring body 241 (hereinafter referred to as "the upper ring body 242 is at an inner side of the lower ring body 241"). An annular gap 244 is formed between an outer circumferential wall of the vertical portion of the upper ring body 242 (hereinafter referred to as "outer circumferential wall of the upper ring body") and an inner circumferential wall of the vertical portion of the lower ring body 241 (hereinafter referred to as "inner circumferential wall of the lower ring body"). Further, as shown in FIG. 3D, a plurality of third through-holes 243 are disposed on the inner circumferential wall of the lower ring body 241 and above a lower end of the upper ring body 242, and the plurality of third through-holes 243 are distributed uniformly along the circumferential direction of the process sub-cavity 211. The annular gap 244 and each third through-hole 243 form an exhaust port for discharging the gas in the process sub-cavity 211 into the loading/unloading sub-cavity 202. During the precleaning process, a discharging, direction of the process gas after reaction is indicated by the arrows in FIG. 3C. After passing through the annular gap 244 and each third through-hole 243 successively, the process gas after reaction is discharged into the loading/unloading sub-cavity 202 and is further pumped out by a vacuum pump 31 from an exhaust port 201 at the bottom of the cavity 20. It is easy to understand that, because the aforementioned annular gap 244 uses a maze structure, the gas flow stability within the process sub-cavity 211 may be improved.

It should be noted that, in practical applications, the aforementioned annular flow homogenizing cavity may be omitted. Instead, a plurality of first through-holes serving as gas inlets are disposed along the circumferential direction of the process sub-cavity. Further, a plurality of first through-holes are directly connected to the process sub-cavity, thereby transporting the process gas uniformly from the periphery to the center of the process sub-cavity.

It should be further noted that, in one embodiment, although the dielectric window 21 uses an arched structure, the present disclosure is not limited thereto. In practical applications, the dielectric window may have any other structure such as a barrel structure according to specific requirements. Further, preferably, a Faraday shield member may be disposed surrounding an inner side the dielectric window, and the Faraday shield member is made of a metal material or an insulating material with a surface plated with a conductive material. By virtue of the Faraday shield member, not only the electromagnetic field may be shielded to reduce erosion of the plasma to the process sub-cavity and prolong the service life of the process sub-cavity, but also cleaning of the chamber may become easier to reduce the usage cost of the chamber. Further, at least one slot configured at the Faraday shield member along an axial direction thereof. That is, the Faraday shield member is completely disconnected at the slot and is a discontinuous barrel structure, thereby effectively preventing the eddy current loss and heat generation of the Faraday shield member.

Figure 6:
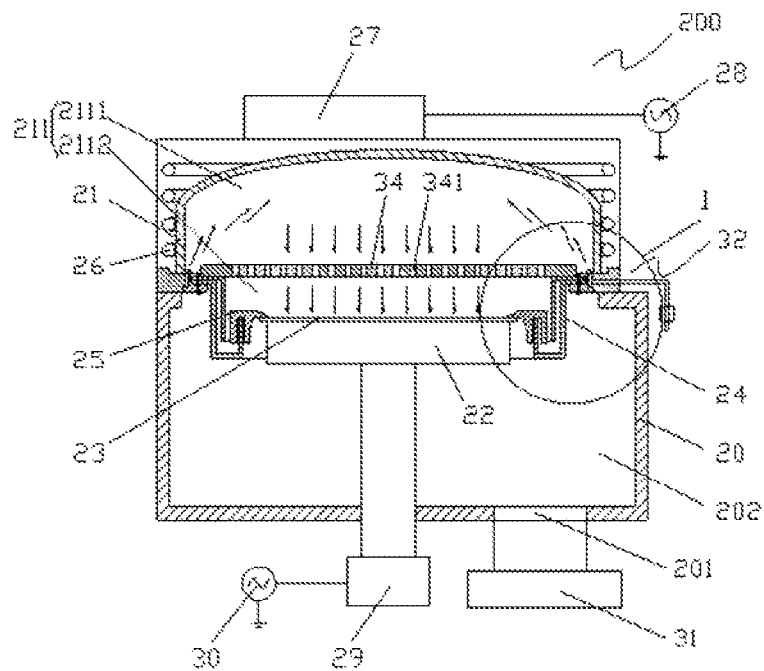
FIG. 6 is a cross-sectional view of a precleaning chamber provided by a second embodiment of the present disclosure.

FIG. 6 is a cross-sectional view of a precleaning chamber provided by a second embodiment of the present disclosure. Referring to FIG. 6, the disclosed precleaning chamber 200 merely differs from that illustrated in the first embodiment in that the precleaning chamber 200 further comprises a filter plate 34. Specifically, the filter plate 34 is made of an insulating material or a metal with a surface plated with an insulating material, and the insulating material comprises ceramic or quartz, etc. Further, the filter plate 34 divides the process sub-cavity 211 into an upper sub-space 2111 and a lower sub-space 2112. The gas inlet of the gas inlet device 32 is connected to the upper sub-space 2111 for directly transporting the process gas into the upper sub-space 2111. Further, a plurality of vent holes 341 are distributed on the filter plate 34, and the plurality of vent holes 341 are connected to the upper sub-space 2111 and the lower sub-space 2112 respectively to filter ions in the plasma when the plasma formed in the upper sub-space 2111 passes through the vent holes 341. Because the space in the vent hole 341 is narrow and small, when the plasma passes through the vent hole 341, chances for the ions in the plasma to contact charged particles such as electrons are greatly increased. Accordingly, the ions may easily capture charged particles such as electrons, etc. for being converted into states such as atoms. Accordingly, no ions but only free radicals, atoms, molecules, etc. may exist in the plasma that passes through the vent holes 341. Such free radicals, atoms, and molecules may continue to diffuse downwards after entering the lower sub-space 2112 until reaching a surface of the wafer 23 placed on the base 22 for etching. Thus, by virtue of the filter plate 34, a function of "filtering" the ions in the plasma may be achieved, such that the negative effects of the ions in the plasma on the material on the wafer 23 is prevented, thereby improving the performance of the product. In practical applications, dimension of the vent hole 341 may be designed using an experimental method as long as a filtering effect of the ions can be realized.

Further, the plurality of vent holes 341 may be distributed uniformly with respect to a plane where the filter plate 34 is located, or a local distribution density of the vent holes 341 may be appropriately adjusted in accordance with the process deviation among individual areas of the surface of the wafer 23. Thus, the densities of plasma densities in each area of the surface of the wafer 23 may be changed, thereby improving the process uniformity.

It should be noted that, in one embodiment, the number of the filter plates 34 is one, but the present disclosure is not limited thereto. In practical applications, the number of filter plates may be two or three or more, and the filter plates may be arranged alternately in a vertical direction, thereby having an effect of performing filtration and gas homogenization on the plasma for multiple times. It is easy to understand that, the sub-space above the topmost filter plate is the plasma generation area, and the gas inlet of the gas inlet device should directly transport the process gas towards the sub-space.

Figure 7:
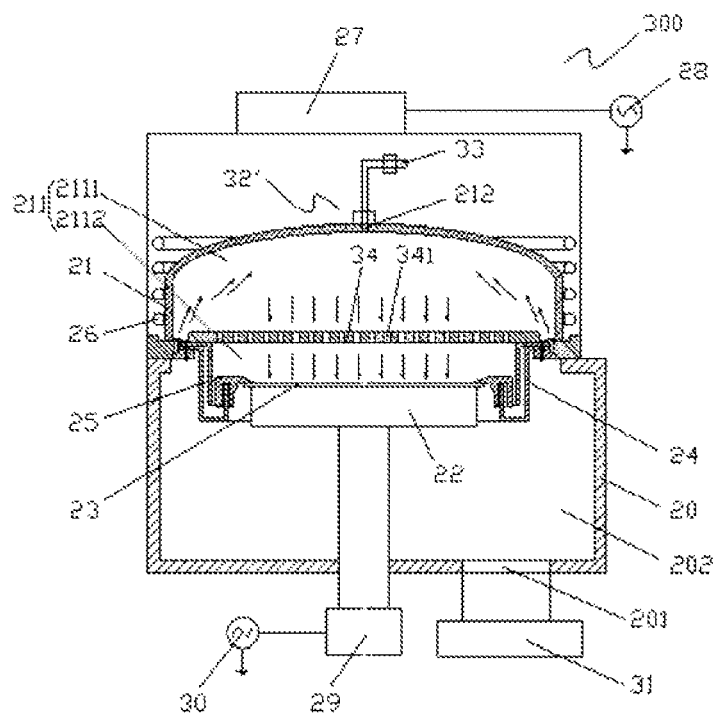
FIG. 7 is a cross-sectional view of a precleaning chamber provided by a third embodiment of the present disclosure.

FIG. 7 is a cross-sectional view of a precleaning chamber provided by a third embodiment of the present disclosure. Referring to FIG. 7, the disclosed precleaning chamber 300 merely differs from that illustrated in the first and second embodiments in that the positions of the gas inlet device with respect to the process sub-cavity are different. Specifically, the gas inlet of the gas inlet device 32' comprises a central gas inlet 212, and the central gas inlet 212 is disposed at a central position of the dielectric window 21' and is connected to the gas inlet line 33, such that the gas may directly enter from the central position at the top of the process sub-cavity 211. Such gas intake method nest only makes the gas flow become smoother, but also allows the obtained process effect to be more stable.

It should be noted that, in practical applications, the gas inlet of the gas inlet device may further comprise at least two top gas inlets that are distributed uniformly at different positions of the dielectric window. By virtue of a plurality of top gas inlets for gas intake at different positions at the top of the process sub-cavity 211, respectively, partitioned air admission may be realized, thereby improving the distribution uniformity of the gas in the process sub-cavity 211.

It should be further noted that, in each of the aforementioned embodiments, the base 22 comprises an electrostatic chuck or a mechanical chuck for carrying the wafer 23. Further, the base 22 may further configure a heater for controlling a temperature of the wafer 23 according to specific requirements.

As another technical solution, embodiments of the present disclosure further provide a plasma processing apparatus comprising a precleaning chamber. The precleaning chamber may use the precleaning chamber provided in any of the above-described embodiments of the present disclosure.

By adopting the aforementioned precleaning chamber provided by any of the above-described embodiments of the present disclosure, the plasma processing apparatus provided by embodiments of the present disclosure may not only shorten the gas inlet path of the process gas, but also obtain a desired plasma density under the situation where a relatively small amount of process gas is introduced. Accordingly, the usage amount of the process gas may be reduced, and the process cost may be decreased.

It should be understood that, the above-described implementations are merely exemplary implementations used for illustrating the principle of the present disclosure; and however, the present disclosure is not limited thereto. Various modifications and improvements can be made by those ordinarily skilled in the relevant art without departing from the spirit and essence of the present disclosure, and these modifications and improvements also shall fall within the protection scope of the present disclosure.

What is claimed is:

1. A precleaning chamber comprising a cavity and a dielectric window disposed at a top of the cavity, a base and a process assembly surrounding the base being configured in the precleaning chamber, the base, the process assembly and the dielectric window together forming a process sub-cavity above the base, a space of the cavity below the base being used as a loading/unloading sub-cavity, the precleaning chamber further comprising a gas inlet device, and the gas inlet device including a gas inlet, wherein:

the gas inlet is configured to directly transport a process gas into the process sub-cavity from a vertical level above the process assembly, and the process assembly includes an annular gap that forms a maze structure, and outgoing through-holes that are distributed uniformly along a circumferential direction of the process sub-cavity, and the annular gap and each of the outgoing through-holes form an exhaust outlet for discharging a gas out of the process sub-cavity into an exhaust port of the loading/unloading sub-cavity.

2. The precleaning chamber according to claim 1, wherein:

the gas inlet device further comprises an annular flow homogenizing cavity, the annular flow homogenizing cavity is connected to the gas inlet and is connected to the process sub-cavity via a plurality of gas outlets, and the plurality of gas outlets are distributed uniformly along the circumferential direction of the process sub-cavity.

3. The precleaning chamber according to claim 2, wherein the gas inlet device comprises:

an inlet ring, located between the dielectric window and the cavity, and being respectively and tightly connected to the dielectric window and the cavity, wherein at least one first through-hole that penetrates through an inner circumferential wall in a radial direction of the inlet ring is formed on the inner circumferential wall of the inlet ring and is used as the gas inlet; and a flow homogenizing ring, located at an inner side of the inlet ring and forming an annular space together with the inner circumferential wall of the inlet ring, wherein an annular flow homogenizing room is formed at a top of the flow homogenizing ring, the annular flow homogenizing room comprises a plurality of second through-holes distributed uniformly along the circumferential direction of the process sub-cavity, and the plurality of second through-holes are respectively connected to the annular space and the process sub-cavity and are used as the gas outlets.

4. The precleaning chamber according to claim 1, wherein the gas inlet device comprises a central gas inlet disposed at a central position of the dielectric window.

5. The precleaning chamber according to claim 1, wherein the gas inlet comprises at least two top gas inlets that are distributed uniformly at different positions of the dielectric window.

6. The precleaning chamber according to claim 1, wherein:

the precleaning chamber further comprises a filter plate, the filter plate divides the process sub-cavity into an upper sub-space and a lower sub-space, and the gas inlet is connected to the upper sub-space, and a plurality of vent holes are distributed on the filter plate, and the vent holes are respectively connected to the upper sub-space and the lower sub-space, such that ions in plasma are filtered when the plasma formed in the upper sub-space passes through the vent holes.

7. The precleaning chamber according to claim 1, wherein:

the process assembly comprises an upper ring body and a lower ring body, the upper ring body is located at an inner side of the lower ring body, and the annular gap is formed between an outer circumferential wall of the upper ring body and an inner circumferential wall of the lower ring body, the outgoing through-holes include a plurality of third through-holes, and the plurality of third through-holes are disposed on the inner circumferential wall of the lower ring body and above a lower end of the upper ring body.

8. The precleaning chamber according to claim 1, wherein the dielectric window has an arched structure or a barrel structure.

9. The precleaning chamber according to claim 1, wherein:

a Faraday shield member is disposed surrounding an inner side of the dielectric window, and the Faraday shield member is made of a metal material or an insulating material with a surface plated with a conductive material, and at least one slot is configured at the Faraday shield member along an axial direction.

10. A plasma processing apparatus comprising a precleaning chamber, wherein:

the precleaning chamber comprises a cavity, a dielectric window being disposed at a top of the cavity, and a gas inlet device including a gas inlet, a base and a process assembly surrounding the base are configured in the precleaning chamber, the base, the process assembly and the dielectric window together form a process sub-cavity above the base, a space of the cavity below the base is used as a loading/unloading sub-cavity, the gas inlet is configured to directly transport a process gas into the process sub-cavity from a vertical level above the process assembly, and the process assembly includes an annular gap that forms a maze structure, and outgoing through-holes that are distributed uniformly along a circumferential direction of the process sub-cavity, and the annular gap and each of the outgoing through-holes form an exhaust outlet for discharging a gas out of the process sub-cavity into an exhaust port of the loading/unloading sub-cavity.

11. The plasma processing apparatus according to claim 10, wherein:

the gas inlet device further comprises an annular flow homogenizing cavity, the annular flow homogenizing cavity is connected to the gas inlet and is connected to the process sub-cavity via a plurality of gas outlets, and the plurality of gas outlets are distributed uniformly along the circumferential direction of the process sub-cavity.

12. The plasma processing apparatus according to claim 11, wherein the gas inlet device comprises:

an inlet ring, located between the dielectric window and the cavity, and being respectively and tightly connected to the dielectric window and the cavity, wherein at least one first through-hole that penetrates through an inner circumferential wall in a radial direction of the inlet ring is formed on the inner circumferential wall of the inlet ring and is used as the gas inlet; and a flow homogenizing ring, located at an inner side of the inlet ring and forming an annular space together with the inner circumferential wall of the inlet ring, wherein an annular flow homogenizing room is formed at a top of the flow homogenizing ring, the annular flow homogenizing room comprises a plurality of second through-holes distributed uniformly along the circumferential direction of the process sub-cavity, and the plurality of second through-holes are respectively connected to the annular space and the process sub-cavity and are used as the gas outlets.

13. The plasma processing apparatus according to claim 10, wherein the gas inlet device comprises a central gas inlet disposed at a central position of the dielectric window.

14. The plasma processing apparatus according to claim 10, wherein the gas inlet comprises at least two top gas inlets that are distributed uniformly at different positions of the dielectric window.

15. The plasma processing apparatus according to claim 10, wherein:
the precleaning chamber further comprises a filter plate, the filter plate divides the process sub-cavity into an upper sub-space and a lower sub-space, and the gas inlet is connected to the upper sub-space, and
a plurality of vent holes are distributed on the filter plate, and the vent holes are respectively connected to the upper sub-space and the lower sub-space, such that ions in plasma are filtered when the plasma formed in the upper sub-space passes through the vent holes.

16. The plasma processing apparatus according to claim 10, wherein:
the process assembly comprises an upper ring body and a lower ring body, the upper ring body is located at an inner side of the lower ring body, and the annular gap is formed between an outer circumferential wall of the upper ring body and an inner circumferential wall of the lower ring body,
the outgoing through-holes include a plurality of third through-holes, and
the plurality of third through-holes are disposed on the inner circumferential wall of the lower ring body and above a lower end of the upper ring body.

17. The plasma processing apparatus according to claim 10, wherein the dielectric window has an arched structure or a barrel structure.

18. The plasma processing apparatus according to claim 10, wherein:
a Faraday shield member is disposed surrounding an inner side of the dielectric window, and the Faraday shield member is made of a metal material or an insulating material with a surface plated with a conductive material, and
at least one slot is configured at the Faraday shield member along an axial direction.

* * * * *